United States Patent

Chen et al.

[11] Patent Number: 6,040,731
[45] Date of Patent: Mar. 21, 2000

[54] DIFFERENTIAL PAIR GAIN CONTROL STAGE

[75] Inventors: Ricky Y. Chen, Irvine; Lloyd F. Linder, Agoura Hills; Don C. Devendorf, Carlsbad; Matthew S. Gorder, Riverside, all of Calif.

[73] Assignee: Raytheon Company, El Segundo, Calif.

[21] Appl. No.: 08/848,930

[22] Filed: May 1, 1997

[51] Int. Cl.[7] .................................. G06F 7/44; H03L 5/00
[52] U.S. Cl. ........................................ 327/359; 327/307
[58] Field of Search ............................ 327/307, 355–359

[56] References Cited

U.S. PATENT DOCUMENTS

| | | | |
|---|---|---|---|
| 5,115,409 | 5/1992 | Stepp | 327/357 |
| 5,329,189 | 7/1994 | Ushida et al. | 327/355 |
| 5,448,772 | 9/1995 | Grandfield | 327/357 |
| 5,532,637 | 7/1996 | Khoury et al. | 327/355 |
| 5,548,840 | 8/1996 | Heck | 327/358 |

OTHER PUBLICATIONS

Ulrich L. Rohde and T.T.N. Bucher, *Communications Receivers: Principles and Design*, McGraw–Hill, Inc., 1988, pp 238–246.

Paul R. Gray and Robert G. Meyer, *Analysis and Design of Analog Integrated Circuits*, Second Edition, John Wiley and Sons, Inc., 1984, pp. 679–681.

*Primary Examiner*—Toan Tran
*Attorney, Agent, or Firm*—Leonard A. Alkov; William C. Schubert; Glenn H. Lenzen, Jr.

[57] ABSTRACT

A "gain control differential pair" (GCDP) conducts current in response to a differential drive signal, with the gain of a signal path formed via the current circuit of one of its transistors controlled by the drive signal. The GCDP is preferably driven with a drive circuit that receives a symmetrical input signal and produces an offset differential drive signal which has the effect of keeping one of the GCDP's transistors turned off over a wider portion of a symmetrical input signal's voltage range, thereby reducing GCDP-caused noise. One or more GCDPs are implemented as part of a Gilbert mixer to regulate the amount of RF current that flows between the mixer's output and input stages, which eliminates the need to provide gain control in other circuits fed by the mixer. When driven with an offset drive signal, the Gilbert mixer simultaneously provides gain control, low distortion, low power consumption and excellent LO/RF isolation.

16 Claims, 5 Drawing Sheets

DIFFERENTIAL PAIR GAIN CONTROL STAGE

BACKGROUND OF THE INVENTION

1. Field of the Invention

This invention relates to the field of gain control stages, particularly those implemented with a differential pair.

2. Description of the Related Art

Automatic gain control (AGC) circuitry is found in many wireless communication devices, including radios, microwave transceivers and cellular phones. Some of the functional blocks found in these devices, such as IF amplifiers and analog-to-digital converters, perform best when presented with an input having a nearly constant signal strength. However, the variability in the strength of RF signals received by the devices normally causes the strength of these inputs to vary. AGC circuitry, usually placed in the front end of the functional blocks in which it is needed or in its own discrete block, serves to level out the signal strengths of these inputs. The performance advantages provided by the circuitry nearly always outweigh the complexity it adds to the device or block in question. Conventional applications of AGC circuitry are discussed, for example, in Rohde, *Communications receivers: principles and design*, McGraw-Hill, Inc. (1988), pp. 238–246.

A differential pair can be used as an element of an AGC. A differential pair consists of two transistors which are joined at a common junction formed by coupling the emitters of a bipolar pair or the sources of a FET pair, with degeneration resistors sometimes placed between their respective emitter (or source) terminals and the common junction. As shown in FIG. 1, one gain control stage 10 is implemented with a differential pair of npn transistors QA and QB. An input current signal $I_{in}$ is connected to the pair's common emitter junction, and a differential control signal C+ and C− is connected to the pair's respective bases. The stage's current output $I_{out}$ is taken at the collector of QA, with the collector of QB connected to a fixed supply voltage $V_{supply}$. When C+ is greater than C−, QA conducts more current than QB and the stage's gain, i.e., $I_{out}/I_{in}$ is greater than 0.5; when C− is greater than C+, QB conducts more than QA and the stage's gain is less than 0.5. As used herein, "gain" refers to both the amplification (gain >1) and attenuation (gain <1) of a signal. With the gain control stage of FIG. 1 there can only be attenuation or unity gain, since $I_{out}$ cannot exceed $I_{in}$. The gain can be varied between about 0.01 and about 1; base currents through QA and QB make gains of exactly 0 or 1 practically unattainable.

The collector currents of a bipolar differential pair vary with the pair's differential input voltage over $8V_T$ ($V_T$18 26mv at 25° C.), or about 208 mv; beyond this the differential pair transfer function displays a saturated response and further increasing the input differential voltage does not appreciably change the collector currents. The differential input voltage signal C+ is typically made to swing symmetrically above and below C− by about $4V_T$. When C+ is $4V_T$ above C−, nearly all current $I_{in}$ flows through QA and the stage's gain ≈1; when C+ is $4V_T$ below C−, nearly all current flows through QB and the gain ≈0. Between these extremes, i.e., over most of the differential input voltage signal range, both QA and QB are conducting.

A drawback to the use of a differential pair for gain control is that the pair introduces noise into the signal path, primarily caused by QA's base shot noise, base thermal noise and collector shot noise; the noise contribution from these sources increases when QA's emitter looks into a low impedance, as is presented when QB is conducting. Thus, the gain control stage degrades noise figure when driven by a symmetrical control signal. The noise performance of a differential pair is discussed, for example, in Gray and Meyer, *Analysis and Design of Analog Integrated Circuits*, John Wiley and Sons, Inc. (1984), pp. 679–681.

Another functional block found in most wireless communications devices is a mixer, which converts an incoming high-frequency RF signal down to an intermediate frequency (IF) which can be handled by downstream signal processing circuits. Gilbert multiplier cells, which are discussed, for example, in Gray and Meyer, *supra*, pp. 590–605,are often configured to perform this function; a Gilbert multiplier cell is referred to as a Gilbert mixer when so configured.

A basic Gilbert mixer circuit configured as a downconverter is shown in FIG. 2. The differential voltage components RF+ and RF− of an incoming RF signal are connected to the respective bases of a differential pair of transistors Q1 and Q2, which form the mixer's RF input stage 12 and are biased to operate in their linear region with a current source I1 connected to their common emitter junction. The collector currents $I_{rf1+}$ and $I_{rf1-}$ of Q1 and Q2 vary in accordance with the combination of RF+ and RF−.

The mixer has an output stage 14 consisting of two differential pairs, with the respective collectors of a differential pair Q3/Q4 connected to the respective collectors of a differential pair Q5/Q6. A local oscillator signal (LO) made up of complementary differential voltage components LO+ and LO− is applied to the two pairs, with LO+ connected to the bases of Q3 and Q6, and LO− connected to the bases of Q4 and Q5. The common emitter junction of Q3 and Q4 conducts current $I_{rf1+}$ and the common emitter junction of Q5 and Q6 conducts current $I_{rf1-}$.

Local oscillator signal LO is preferably a 50% duty cycle square wave, and the transistors Q3–Q6 controlled by LO function as switches: when LO+ is high (and LO− is low), Q3 and Q6 are turned on and Q4 and Q5 are off, and when LO+ is low, Q4 and Q5 are turned on and Q3 and Q6 are off. Thus, the flow of $I_{rf1+}$ alternates between switches Q3 and Q4 and the flow of $I_{rf1-}$ alternates between switches Q5 and Q6, in accordance with the state of signal LO.

The current output of the mixer is a signal IF1 made up of differential current components IF1+ and IF1−, which are taken at the collectors of Q3/Q5 and Q4/Q6, respectively. The frequency spectrum of the output signal includes (but is not limited to) components at the sum and difference frequencies, i.e., RF+LO and RF−LO, with RF−LO usually being the down-converted signal of interest (when the mixer is configured as a down converter).

A mixer's output is typically connected to signal processing circuits which, as noted above, are designed to provide optimum performance when processing signals having a nearly constant signal strength. However, the output signal strength of the Gilbert mixer shown in FIG. 2 varies with the strength of the incoming RF signal. This inability to provide a constant signal strength output is a shortcoming which results in the overall performance of the communication device being degraded.

Another problem of the Gilbert mixer shown in FIG. 2 is caused by the junction capacitances inherently found between the collector and base junctions of transistors Q1 and Q2. The transitioning of the LO signal from high to low and vice versa can cause noise and voltage spikes to appear at the respective common junctions of differential pairs Q3/Q4 and Q5/Q6. The junction capacitances of Q1 and Q2 couple the spikes to the RF+ and RF− input signals, respectively, and these input-distorting spikes also pass through the output switches and appear in the mixer's IF1 output.

One remedy for this junction capacitance-induced problem is shown in FIG. 3. Transistors Q7 and Q8 are connected in a cascode configuration between RF input transistors Q1 and Q2 and differential pairs Q3/Q4 and Q5/Q6, respectively, to form an LO/RF isolation stage. Q7 and Q8 both receive a constant base bias voltage $V_{BIAS}$ that cause them both to operate linearly with about unity gain. Voltage spikes that previously were coupled to the RF input are now shunted to the bias circuit. However, due to the voltage drop of between about 0.5 and 0.9 volts introduced into the signal path by Q7 and Q8, use of an isolation stage requires more supply voltage headroom. A higher voltage power supply can provide the additional headroom, but this increases the device's power dissipation, which is particularly undesirable for these mostly battery-powered devices.

SUMMARY OF THE INVENTION

A differential pair and drive circuit are presented which provide a low-noise, low power gain control stage, which is particularly useful when implemented as part of a Gilbert mixer. The gain control stage efficiently provides gain control without introducing excessive noise, and can be implemented as a mixer that provides a nearly constant signal strength output and which effectively isolates its RF input stage from output stage noise and voltage spikes.

The gain control stage includes a "gain control differential pair" (GCDP), preferably comprising npn transistors, which conducts current in response to a differential drive signal connected to the respective transistor bases. The pair's common junction serves as the stage's current input, and the collector of one of the pair transistors serves as the stage's output, forming a signal path via that transistor's current circuit. The differential drive signal controls the current conducted by each transistor, and thereby the signal path's gain.

To reduce the GCDP-caused noise introduced into the signal path, the gain control stage is preferably driven by a drive circuit that receives a symmetrical input signal produced, for example, by an error amplifier component of an AGC circuit, and in response generates an offset differential drive signal to the GCDP, i.e., a drive signal that causes the GCDP transistors to conduct current unsymmetrically for symmetric swings of the input signal. The offset drive signal has the effect of keeping one of the GCDP's transistors (the non-signal path transistor) turned off and thereby presenting a high impedance to the signal path transistor over a wider portion of the symmetrical input signal's voltage range than would be the case with a symmetrical drive signal, effectively reducing the amount of GCDP-caused noise introduced into the signal path.

When implemented as part of a Gilbert mixer, a GCDP is connected between each RF input transistor and its corresponding output stage switch pair and regulates the amount of $I_{rf}$ current that flows between the output and input stage. The GCDP can be driven with either a symmetrical or an offset drive signal to cause the gain imposed on the $I_{rf}$ signal to be varied between about 0.01 and 1. Providing gain control within the mixer eliminates the need to do so in the circuits fed by the mixer, as has previously been the practice; the design of these downstream circuits is thus simplified. Adding the gain control stage to the Gilbert mixer also inherently provides an isolation stage between the input and output stages to prevent output stage noise from coupling into the RF input signal. Thus, both gain control and LO/RF isolation are obtained without additional headroom cost.

The gain control stage is applicable to both single-ended and differential Gilbert mixer configurations, with two GCDPs used for the gain control stage of a differential mixer. When driven with an offset drive signal to reduce noise, the Gilbert mixer simultaneously provides gain control, low distortion, low power consumption and excellent LO/RF isolation.

Further features and advantages of the invention will be apparent to those skilled in the art from the following detailed description, taken together with the accompanying drawings.

DETAILED DESCRIPTION OF THE INVENTION

Figures 1, 2:
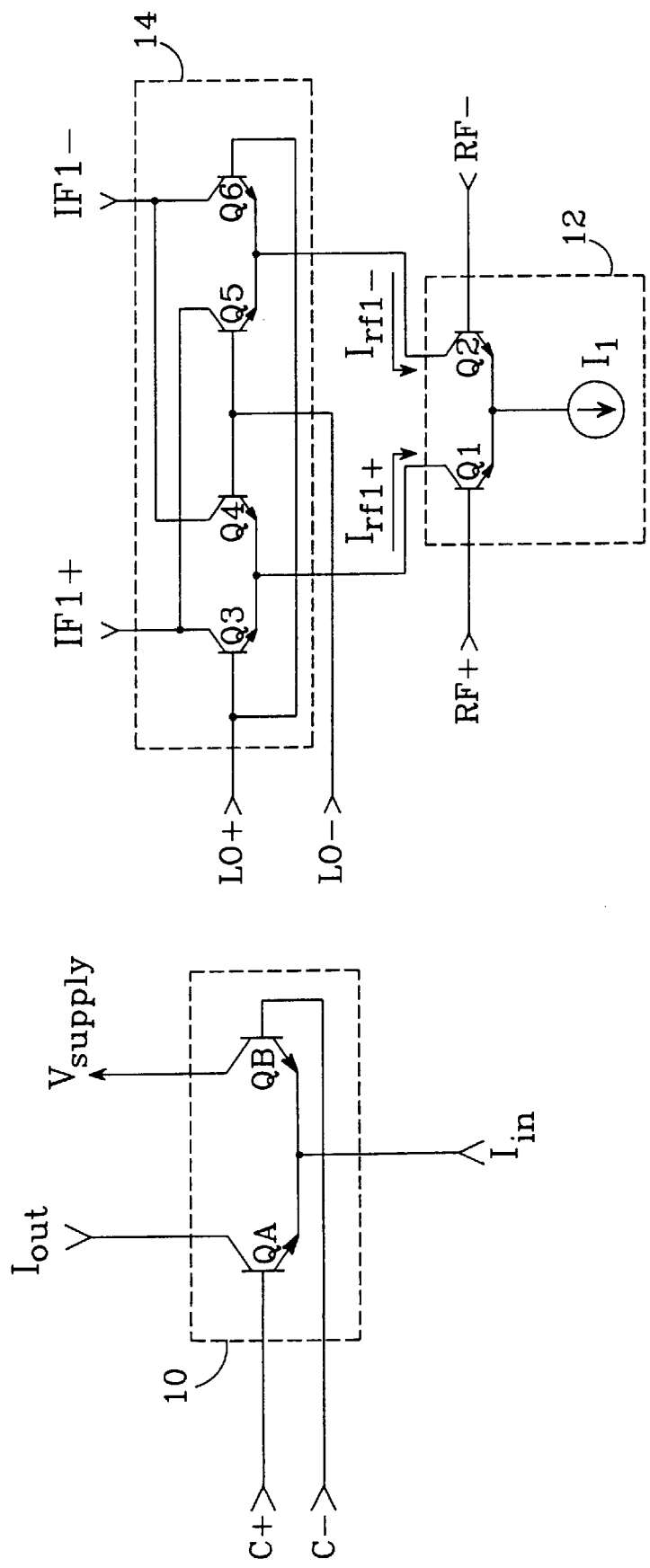
FIG. 1 is a schematic diagram of a known differential pair gain control stage.
FIGS. 2 and 3 are schematic diagrams of known Gilbert mixer circuits.
Figure 4:
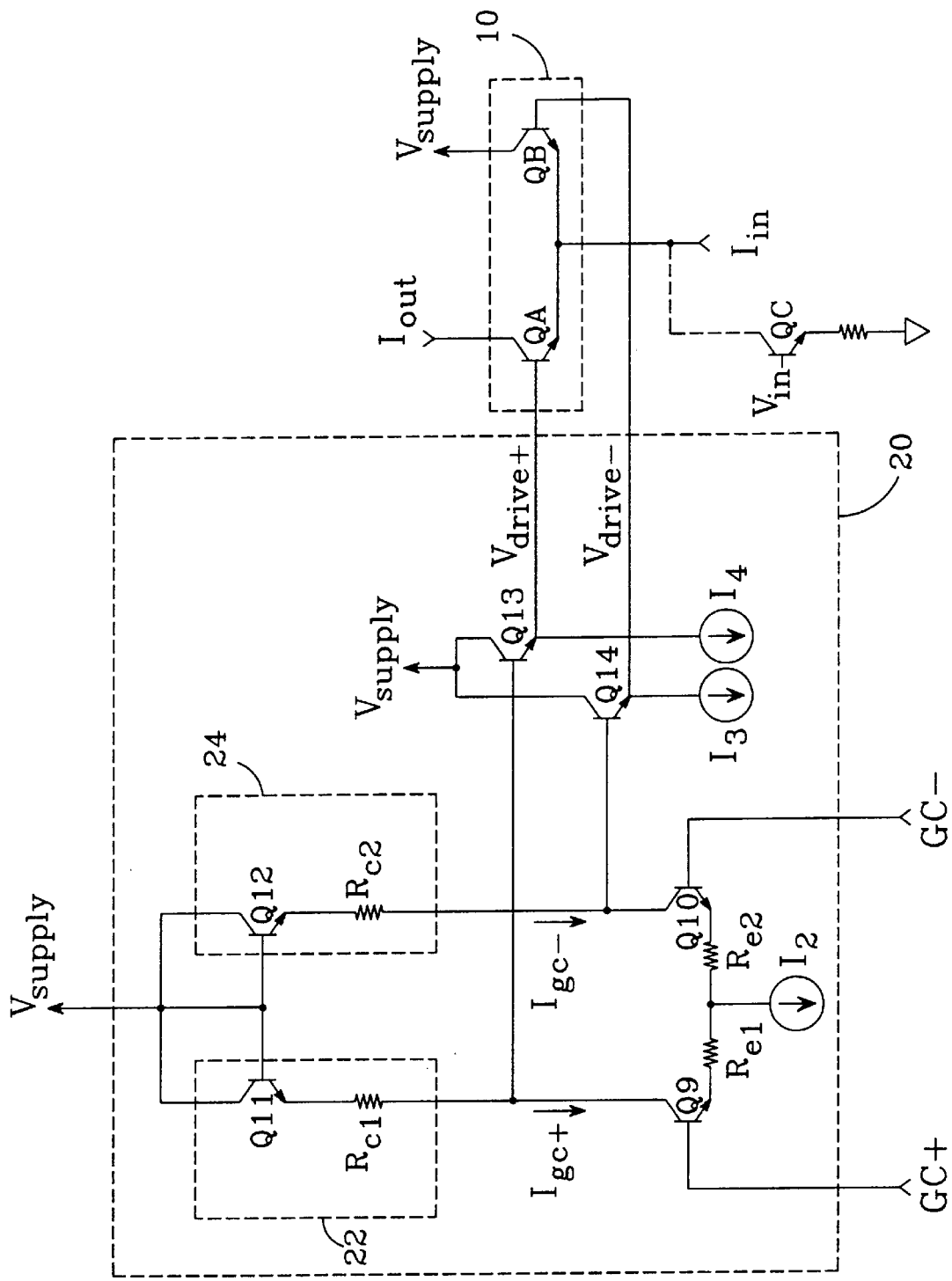
FIG. 4 is a schematic diagram of a gain control stage and drive circuit per the present invention.

A gain control stage and drive circuit per the present invention are shown in FIG. 4. As with the prior art circuit shown in FIG. 1, gain control stage 10 comprises differential pair transistors QA and QB, referred to herein as a "GCDP", with the current circuit of QA providing a signal path between the current input $I_{in}$ and the current output $I_{out}$. The stage 10 has a gain which is controlled by differential drive signals, here designated $V_{drive+}$ and $V_{drive−}$, which are connected to the control (base) inputs of QA and QB, respectively. Signal $I_{in}$ is typically derived by connecting an input voltage $V_{in}$ to the base of a transistor QC which provides current output $I_{in}$ at its collector.

A drive circuit 20 preferably generates the differential signals $V_{drive+}$ and $V_{drive−}$ that control the gain control stage 10. The drive circuit receives as an input symmetrical differential gain control signals GC+ and GC−, which would typically be generated by an AGC circuit (discussed below) that detects the error between the gain control stage's output signal strength and a reference signal strength and generates the GC signal necessary to reduce the error. A "symmetrical" differential signal refers to a signal that has a range or "swing" that extends from a particular positive differential voltage to an equal and opposite negative differential voltage. GC+ and GC− are connected to the bases of a differential pair Q9 and Q10, respectively, which are preferably npn transistors. Degeneration resistors $R_{e1}$ and $R_{e2}$ are preferably connected between the emitters of Q9 and Q10, respectively, and a bias current source I2, and can be chosen to effect a desired scaling of the GC to $V_{drive}$ transfer function.

The differential pair Q9/Q10 converts gain control signals GC+ and GC− into differential currents $I_{gc+}$ and $I_{gc−}$ at the collectors of Q9 and Q10, respectively, which are preferably connected to $V_{supply}$ through respective loads 22 and 24.

Load 22 preferably comprises a compensation resistor $R_{c1}$ connected to the emitter of a diode-connected transistor Q11, and load 24 preferably comprises a compensation resistor $R_{c2}$ connected to the emitter of a diode-connected transistor Q12. The opposite sides of $R_{c1}$ and $R_{c2}$ from Q11 and Q12 are connected to the bases of emitter follower buffer transistors Q13 and Q14, respectively, whose collectors are both connected to $V_{supply}$. The emitters of Q13 and Q14 produce the differential voltage signals $V_{drive+}$ and $V_{drive-}$, respectively. Equal and independent bias current sources I3 and I4 are also connected to the emitters of Q13 and Q14, respectively. $V_{drive}$ varies with GC such that an increase in GC+ results in an increase in $V_{drive+}$.

Loads 22 and 24 may comprise resistors, diodes (including diode-connected transistors), or a combination of both. Diode-connected transistors Q11 and Q12 are preferred over purely resistive loads because the transistors provide superior performance over temperature, since both they and the differential pair Q9/Q10 vary with $V_T$ (=kT/q). Diode-connected transistors are also preferred in an I.C. implementation of drive circuit 20 because emitter area is a better controlled parameter than resistor sheet resistance.

Compensation resistors $R_{c1}$ and $R_{c2}$ are preferably in series with the current circuits of load transistors Q11 and Q12 to compensate for the base current into the emitter follower buffer transistors Q13 and Q14, and serve to slightly increase the differential voltage swing to the gain control stage transistors QA and QB, which turns one GCDP transistor on harder and one off harder at either end of the swing. A value of about 10 Ω is suitable for $R_{c1}$ and $R_{c2}$ when emitter follower buffer transistors Q13 and Q14 are npn transistors. $R_{c1}$ and $R_{c2}$ would not be needed if Q13 and Q14 were MOSFETS, since a MOSFET's gate current is negligible.

The gain control stage 10 introduces noise into the signal path, primarily consisting of QA's base shot noise, base thermal noise and collector shot noise. These noise sources are minimized if QA's emitter looks into a high impedance, as is the case when transistor QB is completely off. It is thus advantageous to keep QB off over as much of the swing of the GC signal as possible. This is accomplished by introducing an offset into the GC to $I_{out}$ transfer function. Without an offset, a GC+ signal that swings symmetrically above and below GC− by about $4V_T$ produces a $V_{drive+}$ signal that swings above and below $V_{drive-}$ by about $4V_T$ (assuming the drive circuit operates with unity gain), which turns QA nearly fully on and QB nearly fully off at one extreme, and vice versa at the other extreme. An offset is introduced that, for the same $\pm 4V_T$ swing in the GC signal, causes $V_{drive+}$ to swing about $6V_T$ above $V_{drive-}$ and about $2V_T$ below $V_{drive-}$, for example. This has the effect of shifting the GC to $I_{out}$ transfer function such that QA is now at least partly conducting throughout the entire range of the GC signal. More importantly, QB is now off when $V_{drive+}$ is between about $4V_T$ and $6V_T$ above $V_{drive-}$, i.e., over about 25% more of GC's input voltage range than without the offset. This added range over which QB is off increases the amount of time that QA's emitter looks into a high impedance, and thus reduces the amount of noise introduced into the signal path by the gain control stage.

The amount of offset is determined by balancing several competing factors. One is the noise figure that is to be met by the circuit; the greater the offset, the lower the noise figure. However, increasing the range over which QA conducts results in some loss of attenuation range. This loss may be compensated for by increasing the GC to $V_{drive}$ voltage gain, which can be accomplished by several methods. For example, increasing the emitter area ratios of Q11 and Q12 with respect to QA and QB reduces the amount of change in GC necessary to achieve a given impact on $I_{out}$. Also, reducing the values of emitter degeneration resistors $R_{e1}$ and $R_{e2}$ increases the transconductance through differential pair Q9/Q10 and thereby the overall GC-to-$V_{drive}$ gain. However, increasing the gain can have the negative effect of increasing the gain control stage's sensitivity to noise in the GC signal. An offset that causes $V_{drive+}$ to swing about $6V_T$ above $V_{drive-}$ and $2V_T$ below $V_{drive-}$ for a GC+ that swings symmetrically about GC− is preferred, because this amount of offset balances the desire to keep QB off over a greater range of GC with a small loss of attenuation range. A gain that is variable between 0.01 and 1 is achievable with this offset, which has the effect of reducing the SSB noise figure from about 19 dB to about 14 dB.

There are a number of ways in which offset can be introduced into the GC to $I_{out}$ transfer function. The preferred method is to fabricate diode-connected load transistors Q11 and Q12 with different emitter areas. Making the emitter area of Q11 larger than that of Q12 results in less voltage being dropped across Q11 than would drop across Q12 for a given current; this unequal voltage drop across the two loads introduces an offset into the GC to $I_{out}$ transfer function. The amount of offset introduced for a given ratio of emitter areas is roughly given by $V_{offset}=V_T \ln A$, where A is the ratio of Q11's emitter area to Q12's emitter area. Thus, when Q11's emitter area is 4 times that of Q12, $V_{offset}$ is about $1.4V_T$, so that $V_{drive+}$ will swing about $5.4V_T$ above and about $2.6V_T$ below $V_{drive-}$.

It is preferred that the emitter areas of Q9 and Q10 be about equal, and that the emitter areas of QA and QB be about equal, so that the two transistors of each pair perform about equally. It is also preferred that the emitter areas of Q11 and Q12 be less than those of QA and QB, to reduce the bias current required to control QA and QB.

Another method of introducing offset into the GC to $I_{out}$ transfer function is by using asymmetrical values for $R_{c1}$ and $R_{c2}$, while keeping the emitter areas of Q11 and Q12 about equal. For example, by making the resistance value of $R_{c1}$ about two times that of $R_{c2}$, a $V_{offset}$ of about $1.4V_T$ is achieved. However, the amount of offset introduced by this approach may vary over temperature. As noted above, the characteristics of Q11 and Q12 will vary with those of Q9 and Q10 over temperature, while the characteristics of resistors $R_{c1}$ and $R_{c2}$ will not. For this reason, the introduction of offset via the emitter ratio method is preferred over the asymmetrical resistor method.

It is also possible to introduce offset by increasing the emitter area of QA with respect to that of QB. This approach, however, results in QB having a higher emitter current density and thus a higher $V_{be}$ than would be the case if the emitter areas of QA and QB were equal. A QB with a high current density can introduce distortion into the signal path via $V_{be}$ modulation, and for this reason, this approach is disfavored.

Gain control stage 10 is preferably driven with offset drive signals to reduce the amount of noise introduced by the stage, but may also be driven with a symmetrical control signal directly if a greater amount of noise can be tolerated. Drive circuit 20 would not be needed in this case, as long as the symmetrical drive signal had sufficient current sourcing (or sinking, for a GCDP of the opposite polarity) capabilities.

The present invention can be used in wireless communication devices, which are commonly battery powered units.

As such, the gain control stage 10 and drive circuit 20 are preferably implemented in an integrated circuit to conserve both space and power. Npn transistors are preferred for the gain control and drive circuits due to the well-developed techniques available to control device parameters such as emitter area, and their speed of operation. Other device families, including pnp transistors and FETs, could also be used to implement the gain control and drive circuits.

Figure 3:
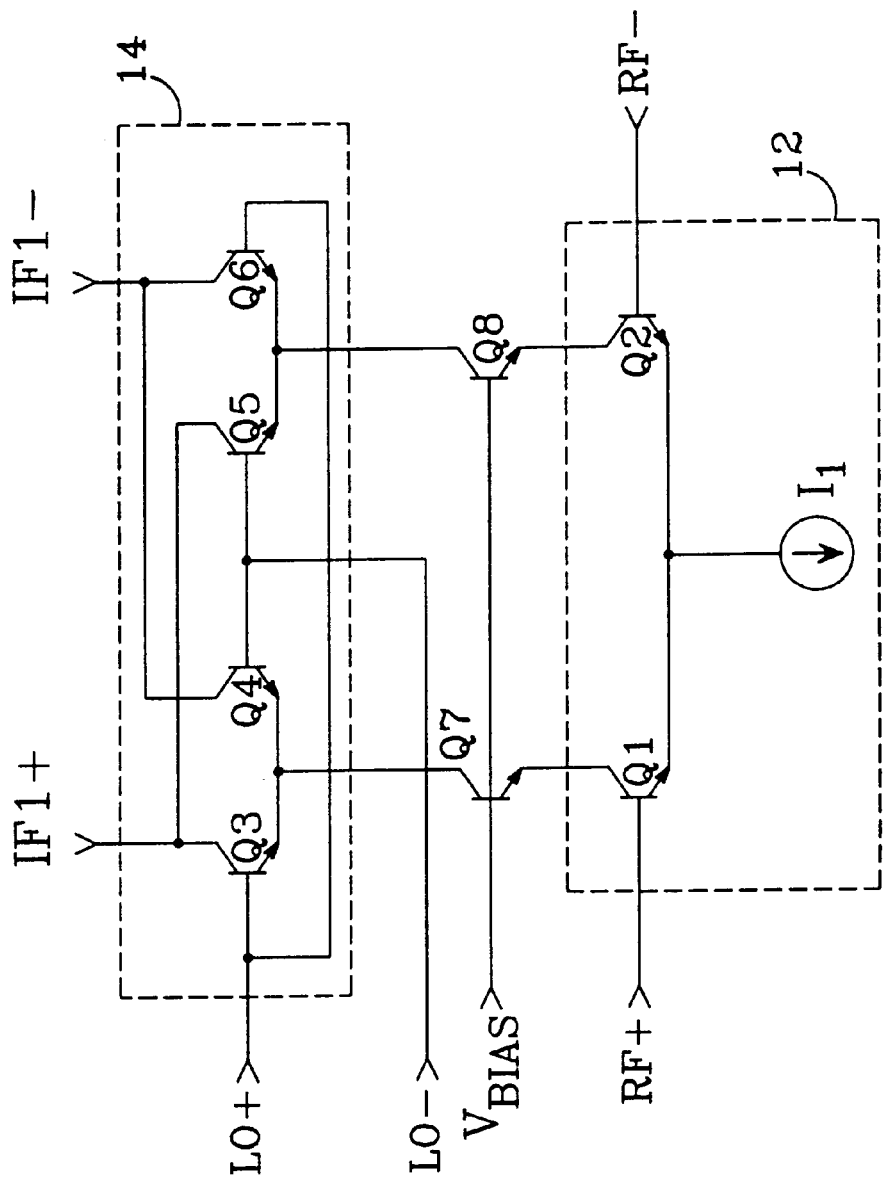
Figure 5:
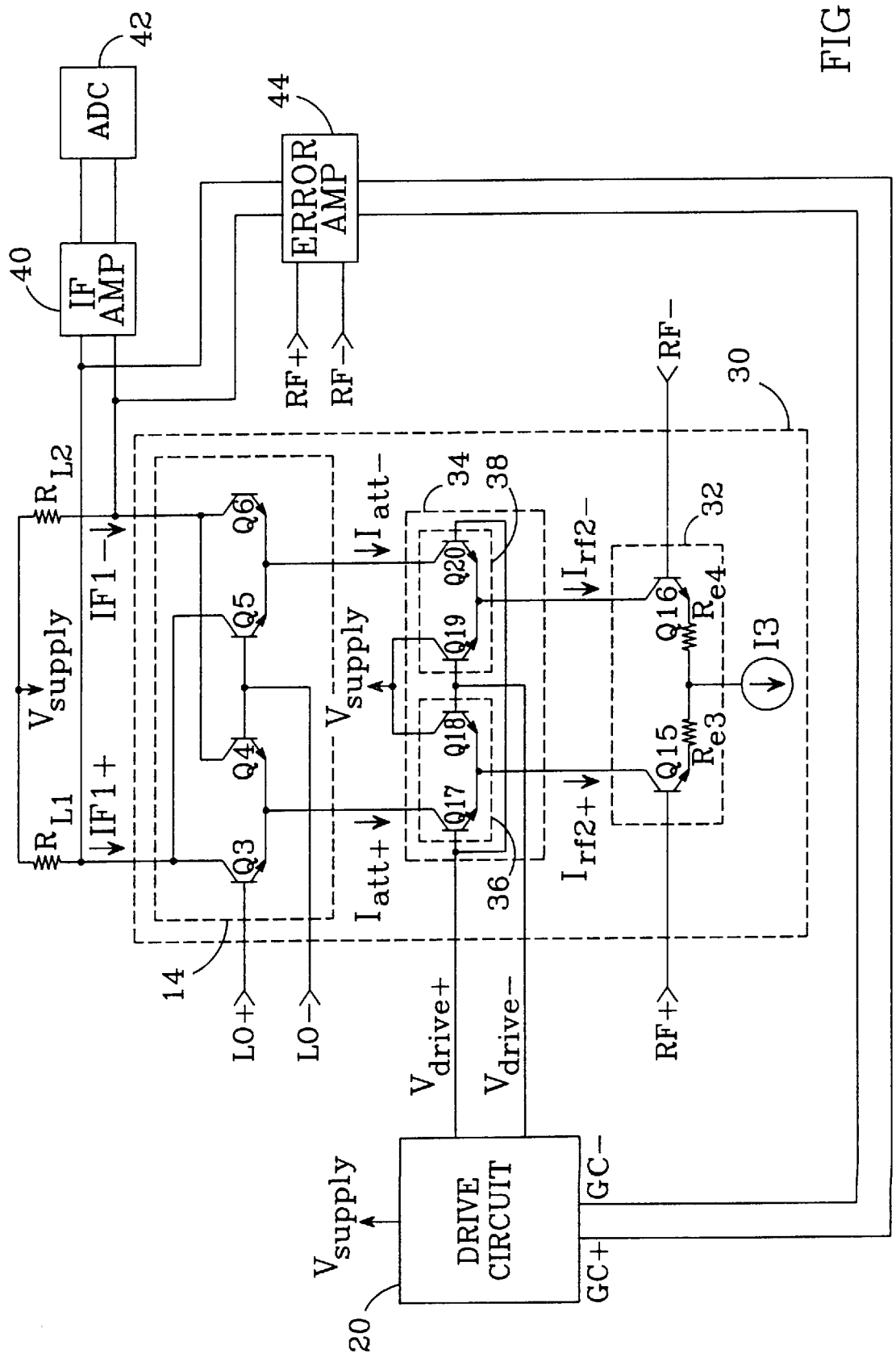
FIG. 5 is a schematic diagram of a differential Gilbert mixer per the present invention.

A primary application of the gain control stage per the present invention is as part of a Gilbert mixer 30 as shown in FIG. 5. The mixer's output stage 14 is unchanged from the prior art circuits shown in FIGS. 2 and 3. The mixer 30 has an RF input stage 32 with a differential pair Q15/Q16, preferably npn transistors, which are biased with a current source I3. Emitter degeneration resistors $R_{e3}$ and $R_{e4}$ are preferably connected between the respective emitters of Q15 and Q16 and the current source I3 to increase the range of input voltages over which the pair operates linearly. Differential RF signal components RF+ and RF− are connected to the bases of Q15 and Q16, respectively, which results in respective collector currents $I_{rf2+}$ and $I_{rf2-}$.

The mixer's output stage 14 operates as before, with the differential current outputs IF1+ and IF1− taken at the collectors of output stage transistors Q3 and Q6, respectively, and differential local oscillator signal components LO+ and LO− causing $I_{rf+}$ and $I_{rf-}$ to be switched alternately between outputs IF1+ and IF1−. LO is a periodic signal, preferably a square wave with a duty cycle of about 50%.

The present invention inserts a gain control stage 34 between the mixer's RF input and output stages. The gain control stage 34 includes two GCDPs 36, 38, which are comprised of differential pairs Q17/Q18 and Q19/Q20, respectively. The common emitter junctions of GCDP 36 and GCDP 38 are respectively connected to the collectors of RF input stage transistors Q15 and Q16. The collector of GCDP transistor Q17 is connected to the common emitter junction of output stage pair Q3 and Q4, while the collector of Q20 is connected to the common emitter junction of output stage pair Q5 and Q6. The collectors of the other two GCDP transistors Q18 and Q19 are connected to fixed supply voltage $V_{supply}$.

The GCDPs 36 and 38 incorporated into the Gilbert mixer 30 operate the same as gain control stage 10. For each GCDP, a differential control signal is connected to the respective bases of the pair's transistors, and current flows through the transistors in accordance with the control voltages. In the differential Gilbert mixer of FIG. 5, one component of the differential control signal is connected to the bases of GCDP transistors Q17 and Q20 and the other component is connected to the bases of Q18 and Q19, causing the two GCDPs move together.

The gain control stage 34 can be driven by a symmetrical differential control signal, but as noted above doing so causes noise to be introduced into the RF-to-IF1 signal path over most of the useful range of the control signal due to the low impedance presented to GCDP transistors Q17 and Q20 when corresponding transistors Q18 and Q20 are conducting. To improve the noise performance, the gain control stage 34 is preferably controlled by drive circuit 20, described above and shown in FIG. 4, which produces offset differential control signals $V_{drive+}$ and $V_{drive-}$ in response to a symmetrical differential input voltage GC+ and GC−.

Adding gain control stage 34 to the mixer 30 does not increase the mixer's power dissipation, because the GCDPs 36, 38 use the same bias current I3 as is already used by the output and input stages. The gain control stage 34 does require about 0.5 to 0.9 volts more headroom than does the basic Gilbert mixer shown in FIG. 2, but no more than is needed to provide a LO/RF isolation stage (as provided with a cascode configuration such as that shown in FIG. 3) between the output and input stages. Thus, the invention efficiently adds gain control to a communications device's mixer block without increasing the block's supply voltage or bias current requirements.

The gain control stage 34 is typically used as an element of an AGC loop, an example of which is shown in FIG. 5. The mixer's differential current outputs IF1+ and IF1− are drawn through load resistors $R_{L1}$ and $R_{L2}$ to create a differential voltage which is fed to an IF amplifier 40, which in turn feeds other signal processing circuits such as an analog-to-digital converter (ADC) 42. An error amplifier 44 compares the strengths of the mixer's output signals with a differential reference signal REF+ and REF− which represents the desired signal strength, and generates differential control signals GC+ and GC− to reduce the error. By including the gain control stage 34 within the Gilbert mixer 30, the need to incorporate gain control into the IF amplifier 40 or the ADC 42, or to add a discrete gain control circuitry block, is eliminated.

Figure 6:
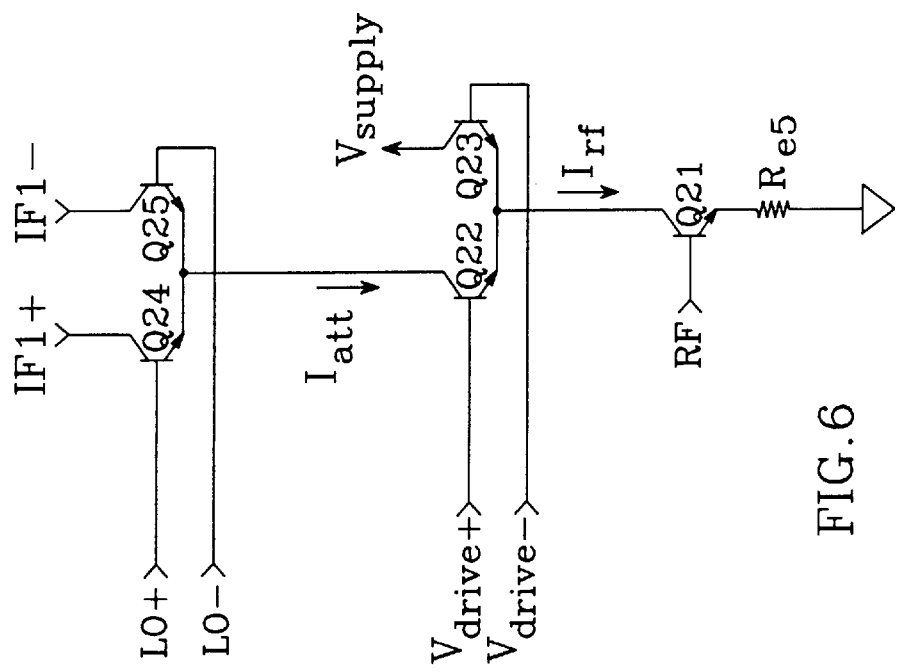
FIG. 6 is a schematic diagram of a single-ended Gilbert mixer per the present invention.

A Gilbert mixer per the present invention can also be implemented in a single-ended configuration as shown in FIG. 6. For this embodiment, the RF input stage comprises only input transistor Q21, which is preferably connected to ground through degeneration resistor $R_{e5}$. The gain control stage is a single GCDP comprised of transistors Q22 and Q23, which are preferably driven by offset differential drive signals $V_{drive+}$ and $V_{drive-}$, and the output stage comprises differential pair transistors Q24 and Q25 which produce differential current outputs IF1+ and IF1− at their respective collectors. To maintain proper voltage (RF) to current ($I_{rf}$) conversion, the emitter of Q21 must be at a constant voltage. In the differential configuration of FIG. 5, current source I3 creates a constant voltage AC ground at the junction of the input stage's emitter resistors (assuming that RF+ and RF− are symmetrical). This AC ground is lost in a single-ended configuration, so Q21 is grounded to provide the necessary constant voltage. Signals LO+, LO−, $V_{drive+}$ and $V_{drive-}$ perform the same functions in both differential and single-ended configurations.

Figure 7:
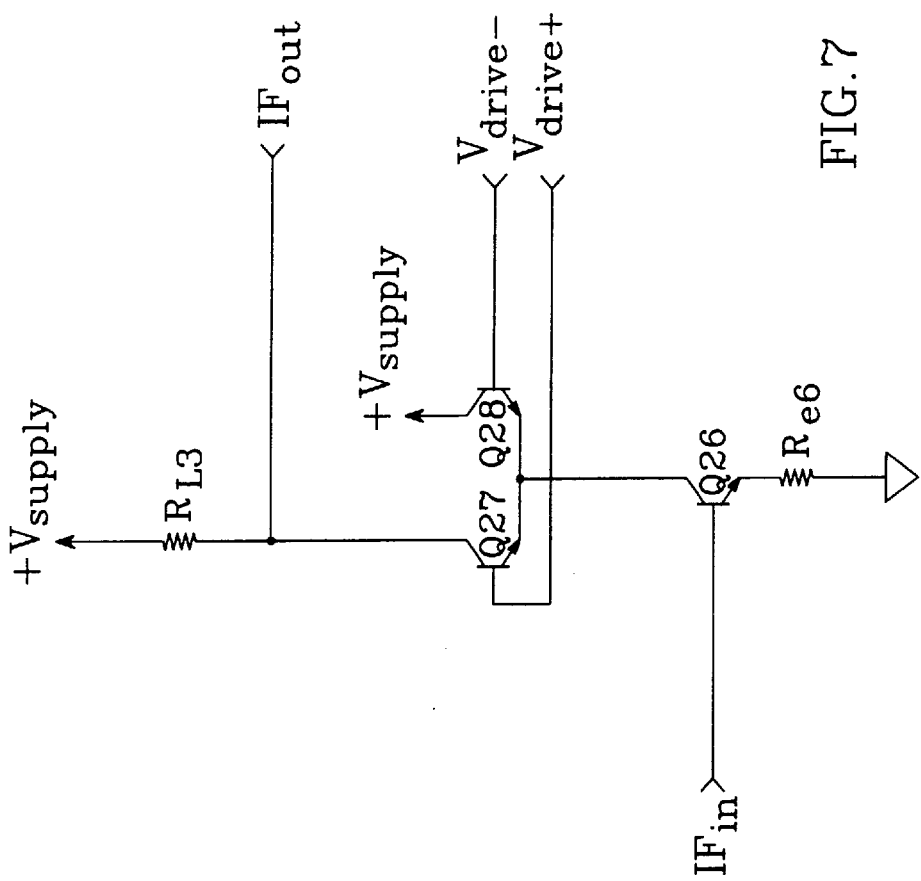
FIG. 7 is a schematic diagram of a gain control stage per the present invention in an IF amplifier application.

The gain control stage described herein can be incorporated into other circuits as well. An application of the gain control stage to an IF amplifier is shown in FIG. 7. In the absence of the invention, this IF amplifier comprises an npn transistor Q26 which receives an input signal $IF_{in}$ at its base and produces an output $IF_{out}$ at its collector through a load resistor $R_{L3}$. In accordance with the invention, a GCDP comprising transistors Q27 and Q28 is provided, with the collector-emitter circuit of Q27 connected between $R_{L3}$ and the collector of Q26, to regulate the current drawn through RL3 and thus the signal strength of the output $IF_{out}$. The GCDP is preferably driven by offset differential drive signals $V_{drive+}$ and $V_{drive-}$ to obtain the noise reduction advantages discussed above.

As with the gain control stage 10 and drive circuit 20 discussed above, the Gilbert mixers shown in FIGS. 5 and 6, and the IF amplifier shown in FIG. 7, are not restricted to npn transistor implementations. Pnp transistors and FETs are also acceptable. Npn transistors are preferred, however, due to the well-developed techniques available to control device parameters such as emitter area, and their speed of operation.

While particular embodiments of the invention have been shown and described, numerous variations and alternate embodiments will occur to those skilled in the art. Accordingly, it is intended that the invention be limited only in terms of the appended claims.

We claim:

1. A differential pair gain control stage with offset, comprising:
   a first differential pair comprising first and second transistors having respective control inputs and respective current circuits controlled by said control inputs with said current circuits connected at a common junction, said common junction forming a current input, said first transistor's current circuit providing a current output and said second transistor's current circuit connected to a line that is adapted to receive a fixed supply voltage, and
   a drive circuit comprising a second differential transistor pair having respective control inputs and respective current circuits controlled by said control inputs, said control inputs connected to receive a differential input signal, said current circuits connected to a supply voltage line through respective loads to produce respective drive signals which vary with said differential input signal and are connected to said control inputs of said first differential pair to control the flow of current between said current input and said current output,
   said loads arranged to introduce an offset into the transfer function between said differential input signal and said drive signals that increases the range over which said first transistor conducts current for a symmetrical differential input signal.

2. The gain control stage of claim 1, wherein said first and second differential pairs comprise bipolar transistors.

3. The gain control stage of claim 1, wherein said loads comprise respective diode-connected transistors having unequal emitter areas.

4. The gain control stage of claim 1, wherein said loads comprise respective resistors having unequal resistance values.

5. The gain control stage of claim 1, further comprising a Gilbert mixer having an input stage coupled to said first differential pair and an output stage coupled to said second differential transistor pair, with said gain control stage connected to control the flow of current between said input and output stages.

6. The gain control stage of claim 1, further comprising an intermediate frequency (IF) amplifier having an input coupled to said first differential pair and an output coupled to said second differential transistor pair, with said gain control stage connected to control the flow of current between said amplifier input and output.

7. A Gilbert mixer with gain control, comprising:
   an input stage which converts an input voltage signal to a current signal,
   a gain control stage coupled to said input stage, and
   an output stage coupled to said gain control stage, which has two current outputs and alternatively switches said current signal between said outputs in response to a first control voltage,
   wherein said gain control stage regulates the flow of said current signal between said input and output stages in response to a second control voltage and said gain control stage comprises a first differential pair comprising first and second transistors having respective control inputs and respective current circuits with said current circuits connected at a common junction, said common junction is connected to said input stage, said first transistor's current circuit is connected to said output stage and said second transistor's current circuit is connected to a line adapted to receive a fixed supply voltage.

8. The Gilbert mixer of claim 7, further comprising a drive circuit which generates said second control voltage as an output, said drive circuit comprising a differential transistor pair having respective control inputs and respective current circuits, said control inputs connected to receive a differential input signal, said current circuits connected to a supply voltage line through respective loads to produce differential drive signals which vary with said differential input signal and are connected to the respective control inputs of said first and second transistors, said loads arranged to introduce an offset into the transfer function between said differential input signal and said drive signals that increases the range over which said first transistor conducts current for a symmetrical differential input signal.

9. The Gilbert mixer of claim 7, further comprising a second differential pair comprising third and fourth transistors having respective control inputs and respective current circuits with said current circuits connected at a common junction, said common junction is connected to said input stage, said third transistor's current circuit is connected to said output stage and said fourth transistor's current circuit is connected to a line adapted to receive a fixed supply voltage.

10. The Gilbert mixer of claim 9, further comprising a drive circuit which generates said second control voltage as an output, said drive circuit comprising a differential transistor pair having respective control inputs and respective current circuits, said control inputs connected to receive a differential input signal, said current circuits connected to a supply voltage line through respective loads to produce differential drive signals which vary with said differential input signal, one of said drive signals connected to the respective control inputs of said first and third transistors and the other of said drive signals connected to the respective control inputs of said second and fourth transistors, said loads arranged to introduce an offset into the transfer function between said differential input signal and said drive signals that increases the range over which said first and third transistors conduct current for a symmetrical differential input signal.

11. The Gilbert mixer of claim 10, wherein said loads comprise respective diode-connected transistors having unequal emitter areas.

12. The Gilbert mixer of claim 10, wherein said loads comprise respective resistors having unequal resistance values.

13. The Gilbert mixer of claim 7, wherein said first control voltage is a periodic signal having a duty cycle of about 50%.

14. An automatic gain control (AGC) circuit suitable for use in a wireless communications device, comprising:
   a Gilbert mixer with gain control, comprising:
      an input stage which converts an input voltage signal to a current signal,
      a gain control stage coupled to said input stage, and
      an output stage coupled to said gain control stage, said output stage has two current outputs as outputs of said mixer and alternatively switches said current signal between said outputs in response to a first control voltage,
      wherein said gain control stage regulates the flow of said current signal between said input and output stages in response to a second control voltage; and an error amplifier arranged to compare the signal strengths of said mixer outputs with a reference signal and to generate said second control voltage to maintain the signal strengths of said mixer outputs approximately constant.

15. An automatic gain control (AGC) circuit suitable for use in a wireless communications device, comprising:

a Gilbert mixer with gain control, comprising:
  an input stage which converts an input voltage signal to a current signal,
  a gain control stage coupled to said input stage,
  an output stage coupled to said gain control stage, said output stage has two current outputs as outputs of said mixer and alternately switches said current signal between said outputs in response to a first control voltage,
  wherein said gain control stage regulates the flow of said current signal between said input and output stages in response to a second control voltage, and
  a drive circuit which generates said second control voltage as an output, said drive circuit comprising a differential transistor pair having respective control inputs and respective current circuits, said control inputs connected to receive a differential input signal, said current circuits connected to a supply voltage line through respective loads to produce differential drive signals which vary with said differential input signal; and an error amplifier arranged to compare the signal strengths of said mixer outputs with a reference signal and to generate said differential input signal to said drive circuit to maintain the signal strengths of said mixer outputs approximately constant.

16. The AGC circuit of claim 15, wherein said gain control stage comprises at least one differential transistor pair having respective control inputs which are connected to said differential drive signals, said loads arranged to introduce an offset into the transfer function between said differential input signal and said differential drive signals that increases the range over which one transistor from each of said differential pairs conducts current for a symmetrical differential input signal.

* * * * *